United States Patent
Sahin et al.

(10) Patent No.: US 8,552,791 B2
(45) Date of Patent: Oct. 8, 2013

(54) PROTECTED POWER SWITCH WITH LOW CURRENT CONSUMPTION

(75) Inventors: Volkan Sahin, Santa Clara, CA (US); Murat Okyar, San Jose, CA (US); Hakan Ates Gurcan, Los Gatos, CA (US)

(73) Assignee: Decicon, Inc., San Jose, CA (US)

( * ) Notice: Subject to any disclaimer, the term of this patent is extended or adjusted under 35 U.S.C. 154(b) by 161 days.

(21) Appl. No.: 12/565,132

(22) Filed: Sep. 23, 2009

(65) Prior Publication Data
US 2010/0079195 A1 Apr. 1, 2010

Related U.S. Application Data

(60) Provisional application No. 61/099,478, filed on Sep. 23, 2008.

(51) Int. Cl.
*H03K 17/687* (2006.01)
(52) U.S. Cl.
USPC ............................ 327/427; 327/365; 327/392
(58) Field of Classification Search
USPC .................................................. 327/419–491
See application file for complete search history.

(56) References Cited

U.S. PATENT DOCUMENTS

| | | | |
|---|---|---|---|
| 6,246,222 B1 * | 6/2001 | Nilles et al. | 323/283 |
| 7,531,996 B2 * | 5/2009 | Yang et al. | 323/282 |
| 7,876,077 B2 * | 1/2011 | Nishimori | 323/282 |
| 2005/0093618 A1 * | 5/2005 | Kobayashi et al. | 327/538 |
| 2006/0091870 A1 * | 5/2006 | Yoshida et al. | 323/282 |
| 2006/0158168 A1 * | 7/2006 | Yoshida et al. | 323/282 |
| 2008/0116862 A1 * | 5/2008 | Yang et al. | 323/269 |
| 2010/0026381 A1 * | 2/2010 | Huang | 327/544 |

* cited by examiner

*Primary Examiner* — Lincoln Donovan
*Assistant Examiner* — Brandon S Cole
(74) *Attorney, Agent, or Firm* — Kilpatrick Townsend and Stockton LLP

(57) ABSTRACT

Under-voltage, over-voltage, and temperature detectors disposed in a switching circuit are turned on periodically and in response to an oscillating signal having a low duty cycle. Accordingly, because the voltage and temperature detectors remain off for long durations, their operating currents, and thus the operating current of the switching circuit is substantially reduced. The switching circuit has a current limiting function which is disabled when the switch current is below a threshold value, thereby further decreasing the current consumption of the switching circuit at low switch current levels.

23 Claims, 5 Drawing Sheets

PROTECTED POWER SWITCH WITH LOW CURRENT CONSUMPTION

CROSS-REFERENCES TO RELATED APPLICATIONS

The present application claims benefit under 35 USC 119(e) of U.S. provisional application No. 61/099,478, filed Sep. 23, 2008, entitled "Protected Power Switch With Low Current Consumption," the content of which is incorporated herein by reference in its entirety.

BACKGROUND OF THE INVENTION

Power switches are used in electronic systems for selective distribution of electrical power. One of the simplest forms of power switch is the MOS transistor. When used as a power switch, one of the source/drain terminals of an MOS transistor forms the input terminal of the power switch, and the other one of the source/drain terminals of the MOS transistor forms the output terminal of the power switch. When the MOS transistor is turned on by a voltage applied between its gate and source terminals, a low resistance path forms between its drain and source terminals, thereby connecting the input and output terminals of the switch together.

FIG. 1 is a schematic diagram of a switching circuit 100, as known in the prior art. When the ON terminal 115 is pulled to a logic high level, under-voltage detector 103, over-voltage detector 105, and over-temperature detector 107 are powered up to check the input voltage level and the temperature. The decisions of these detectors appear at their respective output terminals as logic signals. If all of the checked conditions are determined to be within allowable limits, AND gate 109 turns on power switch 101, thereby enabling load 113 to be connected to input power source 111.

FIG. 2 is a transistor schematic diagram of power switch 101 according to one implementation. As shown, power switch 101 (hereinafter alternatively referred to as switch) includes a PMOS transistor 201 that performs the switching operation, and a driver circuitry that includes PMOS transistor 203 and NMOS transistor 205. Transistor 205 is adapted to pull the gate terminal of transistor 201 to the ground potential when a high voltage level is applied to its EN terminal, thus turning transistor 201 on. Transistor 203 is adapted to pull the gate terminal of transistor 201 to the potential of the IN terminal when a low voltage level is applied to its EN terminal, which in turn, turns off transistor 201. Switching circuit 100 does not have current limiting capability.

FIG. 3 is a transistor schematic diagram of switch 101 (see FIG. 1) that has current limiting capability, according to another implementation. Switch 101 of FIG. 3 includes a sense resistor 403, an amplifier 405, and transistors 201, 409. Sense resistor $R_{SNS}$ 403 senses current $I_{SW}$ flowing through transistor 201. The voltage drop across resistor 403 is thus proportional to the current flowing through transistor 201. Voltage source 407 represents a threshold voltage $V_{TH}$ establishing the maximum current $I_{MAX}$ allowed to flow through transistor 201. Amplifier 405's output signal OA is low when $(I_{SW}*R_{403})<V_{TH}$, where $R_{403}$ represents the resistance of resistor 403. Switch 101 is on when transistor 201 is turned on by the low level of signal OA generated by amplifier 405.

When an output overload condition demands a switch current higher than $I_{MAX}$, amplifier 405 increases the gate voltage of transistor 201 to keep the switch current regulated at $I_{MAX}$ which is defined by:

$$I_{MAXPA}=V_{TH}/R_{SNS} \quad (3)$$

When enabling/disabling signal EN is asserted, the output signal OA of amplifier 405 is tri-stated, and transistor 409 is turned on to pull the voltage of the gate terminal of transistor 201 to its source voltage, thereby turning off transistor 201. Amplifier 405 requires a relatively high operating current $I_{AMP}$ in order to maintain the stability of its closed-loop system. The relatively high operating current of amplifier 405 increases the current consumption of switch 101 and that of switching circuit 100 in which it may be disposed.

BRIEF SUMMARY OF THE INVENTION

A switching circuit, in accordance with one embodiment of the present invention includes, in part, an oscillator, a detector, and a first memory element, and a switch. The oscillator generates an oscillating signal. The first detector receives an input signal and the oscillating signal, and in response, generates a first detect signal if the input signal is less than a first threshold value. The first memory element stores the first detect signal in response to the oscillating signal.

In one embodiment, the switching circuit further includes, in part, a second detector that receives the input signal and the oscillating signal, and in response, generates a second detect signal if the input signal is greater than a second threshold value. The second memory element stores the second detect signal in response to the oscillating signal. The switch is further responsive to the second memory element.

In one embodiment, the switching circuit further includes, in part, a third detector that receives the input signal and the oscillating signal, and in response, generates a third detect signal if an operating temperature is detected as exceeding a third threshold value. The third memory element stores the third detect signal in response to the oscillating signal. The switch is responsive to the third memory element. The first, second, and third memory elements may be flip-flops.

A method of switching current to a load, in accordance with one embodiment of the present invention includes, in part, generating an oscillating signal, generating a first detect signal in response to the oscillating signal if an input signal is detected as being less than a first threshold, storing the first detect signal in response to the oscillating signal, and enabling the current to be switched to the load in response to the stored first detect signal.

In one embodiment, the method further includes, in part, generating a second detect signal in response to the oscillating signal if the input signal is detected as being greater than a second threshold, storing the second detect signal in response to the oscillating signal, and enabling the current to be switched to the load in response to the stored second detect signal.

In one embodiment, the method further includes, in part, generating a third detect signal in response to the oscillating signal if an operating temperature exceeds a third threshold value, storing the third detect signal in response to the oscillating signal, and enabling the current to be switched to the load in response to the stored third detect signal.

A switch in, accordance with one embodiment of the present invention includes, in part, a resistive element, a transistor, a comparator, and an amplifier. The transistor is coupled to the resistive element which receives an input voltage. The comparator is responsive to the resistive element and a threshold value. The comparator generates an output signal having a first value if the current flowing through the first transistor is detected as being smaller than a first threshold value. The comparator generates an output signal having a second value if the current flowing through the first transistor is detected as being greater than the first threshold value. The amplifier is disabled in response to the first value of the output signal of the comparator, and enabled in response to the second value of the output signal of the comparator.

A method of switching a current, in accordance with one embodiment of the present invention includes, in part, generating a comparison signal having a first value if the current to be switched is detected as being smaller than a first threshold value and a second value if the current to be switched is detected as being greater than the first threshold value, disabling an amplifier in response to the first value of the comparison signal, enabling the amplifier in response to the second value of the comparison signal.

DETAILED DESCRIPTION OF THE INVENTION

In accordance with one embodiment of the present invention, one or more voltage detectors are turned on periodically to detect variations in the input voltage. Input voltage variations may be caused by a slowly discharging battery supplying a load current. Some embodiments include a temperature detector to detect variations in the temperature. Temperature variations are also slow-changing signals due, for example, to thermal capacitance of the switching circuit and of the package in which it is housed. Because the voltage and temperature detectors remain off for long durations, their operating currents and thus the operating current of the switching circuit is substantially reduced.

Figure 4:
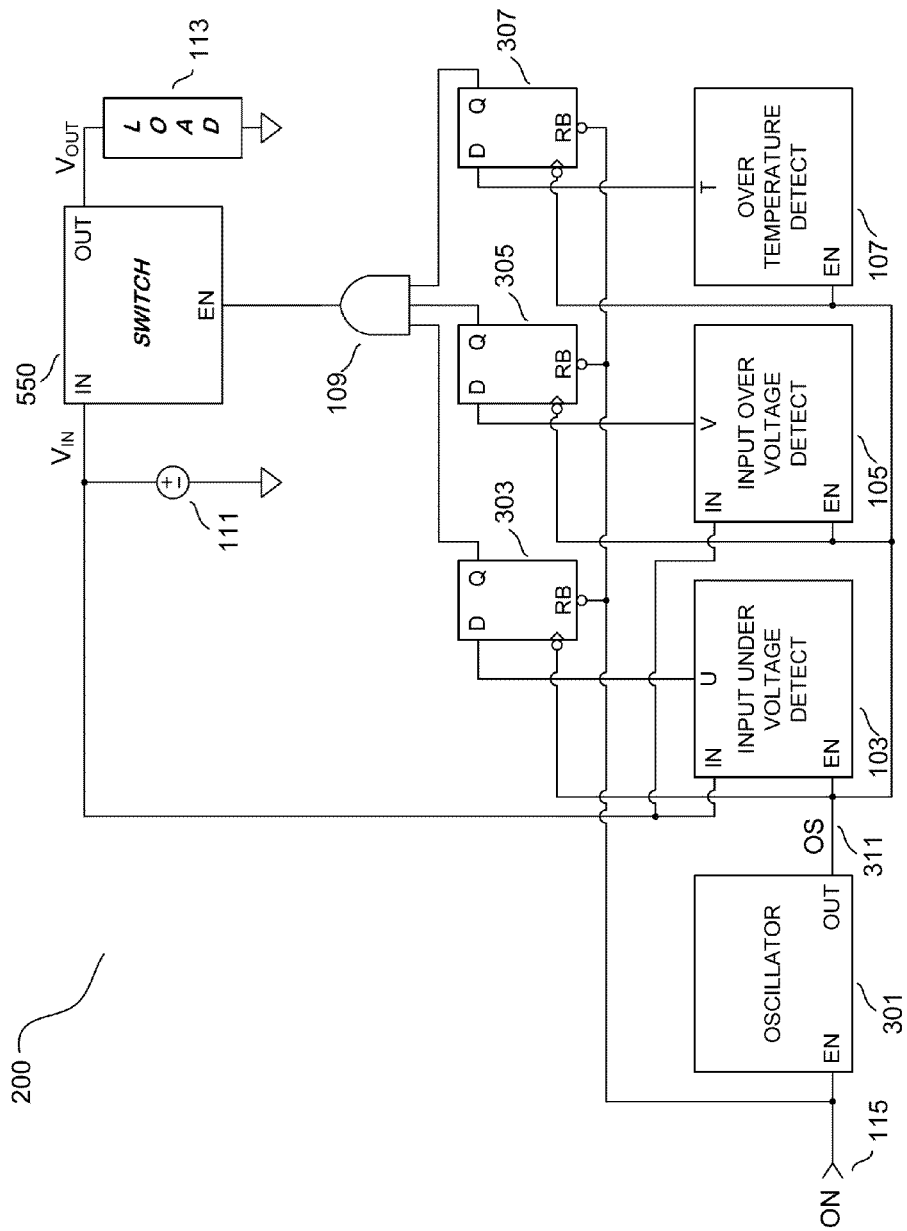
FIG. 4 is a schematic diagram of a switching circuit, in accordance with one exemplary embodiment of the present invention.

FIG. 4 is a schematic diagram of a switching circuit 200, in accordance with one exemplary embodiment of the present invention. Switching circuit 200 is shown as including, in part, an under-voltage detector 103, an over-voltage detector 105, a temperature detector 107, oscillator 301, flip-flops 303, 305, 307, logic AND gate 109, and switch 550 that includes a number of components.

Under-voltage detector 103 is enabled when it receives, for example, a logic high level at its input terminal EN. When enabled, under-voltage detector 103 outputs, for example, a logic low signal at its output terminal U if voltage $V_{IN}$ applied to its input terminal IN is below a predetermined threshold voltage $V_{TH1}$. Conversely, under-voltage detector 103 outputs, for example, a logic high signal at its output terminal U if the voltage level $V_{IN}$ applied to its input terminal IN is above the predetermined threshold voltage $V_{TH1}$. As described further below, under-voltage detector 103 causes switch 550 to turn off if the input voltage $V_{IN}$ is detected as being smaller than the threshold voltage $V_{TH1}$.

Over-voltage detector 105 is enabled when it receives, for example, a logic high level at its input terminal EN. When enabled, over-voltage detector 105 outputs, for example, a logic low signal at its output terminal V if voltage $V_1$ applied to its input terminal IN is above a threshold voltage $V_{TH2}$. Conversely, over-voltage detector 105 outputs, for example, a logic high signal at its output terminal V if the voltage level $V_{IN}$ applied to its input terminal IN is below the threshold voltage $V_{TH2}$. As described further below, over-voltage detector 105 causes switch 550 to turn off if the input voltage $V_{IN}$ is detected as being greater than the threshold voltage $V_{TH2}$.

Temperature detector is enabled when it receives, for example, a logic high level at its input terminal EN. When enabled, temperature detector 107 outputs, for example, a logic low signal at its output terminal T if the temperature of switching circuit 200 is above the threshold temperature level $T_{TH}$. Temperature detector 107 outputs, for example, a logic high signal at its output terminal Y if the temperature of switching circuit 200 is below the predetermined threshold level $T_{TH}$. As described further below, temperature detector 107 causes switch 550 to turn off if the temperature it detects is higher than $T_{TH}$.

Figure 5:
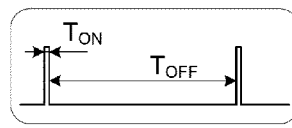
FIG. 5 is a timing diagram of the oscillating signal generated by the oscillator of the switching circuit of FIG. 4, in accordance with one exemplary embodiment of the present invention.

In one embodiment, oscillator 301 has an operating current that is substantially lower than the operating currents of detectors 103, 105, and 107. Oscillator 301 generates an oscillating (periodic) signal OS that has a logic-high duration of $T_{ON}$ and logic-low duration of $T_{OFF}$, as shown in FIG. 5. In the exemplary embodiment shown in FIG. 4, detectors 103, 105, and 107 are enabled during the $T_{ON}$ period and disabled during the $T_{OFF}$ period. As is seen in FIG. 5, $T_{ON}$ has a substantially shorter duration than $T_{OFF}$. $T_{ON}$ is selected to be long enough for detectors 103, 105, and 107 to settle and provide accurate outputs. In the exemplary embodiment shown in FIG. 4, D-type flip-flops (or memory elements) 303, 305 and 307 are clocked at the falling edge of signal OS to respectively latch the outputs of detectors 103, 105, and 107 at the end of each $T_{ON}$ period.

The outputs of flip-flops 303, 305 and 307 are applied to AND gate 109 whose output signal turns on switch 550 if the input voltage and temperature parameters are within allowable limits. If any one of these parameters is outside of the allowable limits, AND gate 109 turns off switch 550. Protection against variations in conditions other than under-voltage, over-voltage, and temperature, such as pressure or humidity may be provided in a similar manner.

The operating current I of switching circuit 200 is defined by the following expression:

$$I=I_{OSC}+T_{ON}/(T_{ON}+T_{OFF})*(I_{UVD}+I_{OVD}+I_{OTD}) \quad (1)$$

where $I_{OSC}$, $I_{UVD}$, $I_{OVD}$, and $I_{OTD}$ respectively represent the currents consumed by oscillator 301, under-voltage detector 103, over-voltage detector 105, and over-temperature detector 107.

Figure 1:
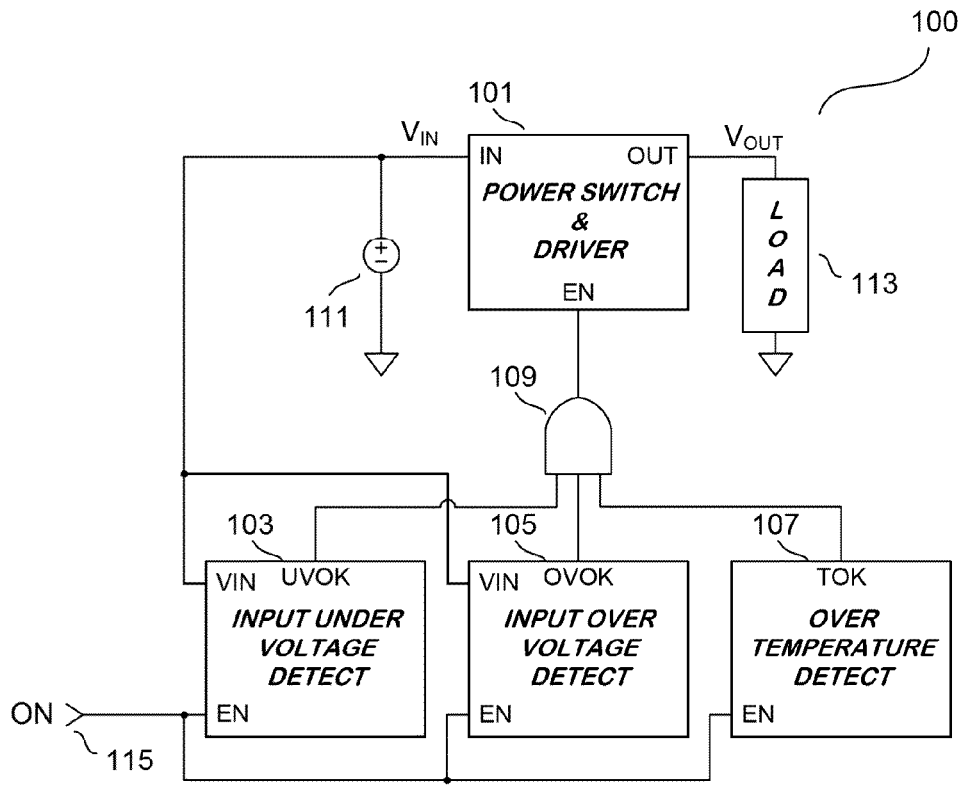
FIG. 1 is a schematic diagram of a switching circuit, as known in the prior art.
Figure 2:
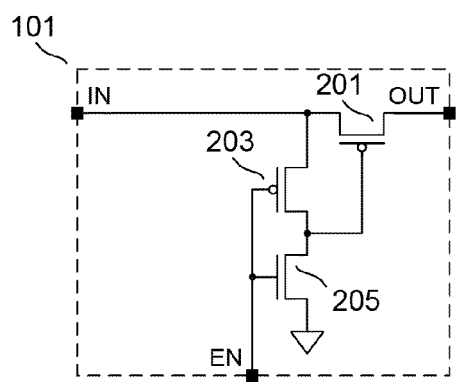
FIG. 2 is a transistor schematic diagram of one implementation of the switch disposed in the switching circuit of FIG. 1, as known in the prior art.
Figure 3:
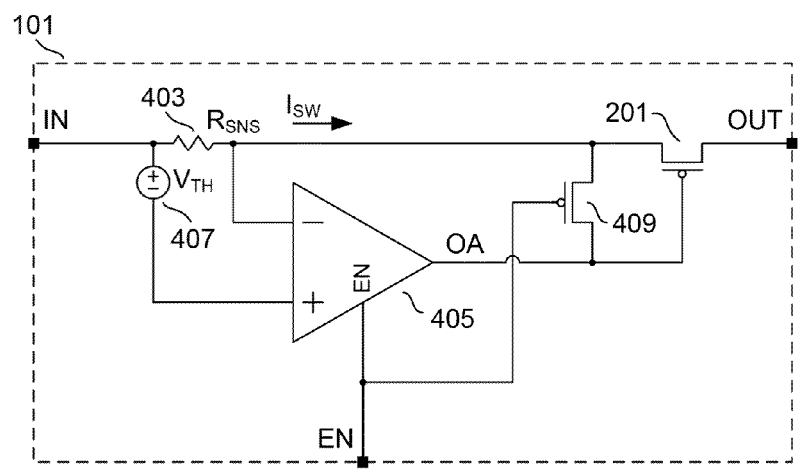
FIG. 3 is a transistor schematic diagram of another implementation of the switch disposed in the switching circuit of FIG. 1, as known in the prior art.

The operating current I of conventional switching circuit 100, shown in FIG. 1, is defined by:

$$I=I_{UVD}+I_{OVD}+I_{OTD} \quad (2)$$

where $I_{UVD}$, $I_{OVD}$, and $I_{OTD}$ respectively represent the currents consumed by the under-voltage detector, over-voltage detector, and over-temperature detector of the switching circuit of FIG. 1. Because $T_{ON}$ is made significantly smaller than $T_{OFF}$, the operating current of switching circuit 200, in accordance with embodiments of the present invention, is substantially smaller than the operating current of conventional switching circuit 100.

In one example, switching circuit 200 operates according to the currents and timing parameters shown below:

$I_{OSC}$=500 nA $I_{UVD}$=5 μA $I_{OVD}$=5 μA $I_{OTD}$=5 μA $T_{ON}$=1 ms $T_{OFF}$=257 ms

It is readily seen that switching circuit 200 consumes nearly 558 nA according to this example. Conventional switch circuit 100 operating under the same conditions, however, consumes 15 μA, which is substantially higher than 558 nA. Although not shown, it is understood that additional current savings may be achieved by turning on/off other circuit elements, such as references (not shown), bias generators (not shown) using the output signal of oscillator 301.

Figure 6:
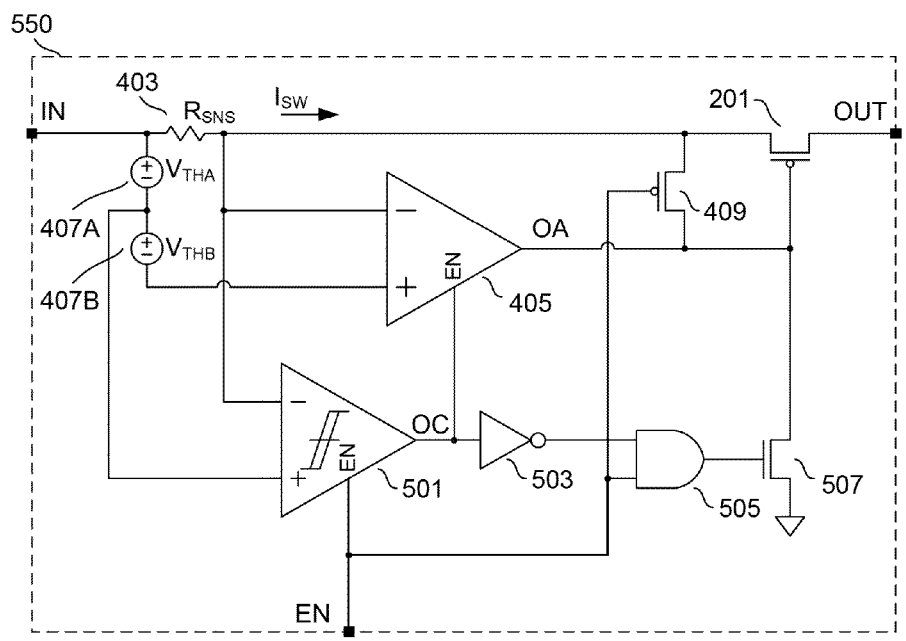
FIG. 6 is a transistor schematic diagram of the switch disposed in the switching circuit of FIG. 4, in accordance with one embodiment of the present invention.

FIG. 6 is a schematic diagram of switch 550 of FIG. 4, in accordance with one exemplary embodiment of the present invention. Switch 550 is shown as including, in part, a comparator 501, an amplifier 405, inverter logic gate 503, AND logic gate 505, and transistors 409, 201, and 507. Comparator 501 is enabled when signal EN is asserted, e.g., pulled to a logic high. The operating current $I_{COMP}$ of comparator 501 is significantly lower than the operating current of amplifier 405. Comparator 501 is adapted to compare the voltage across resistor 403—which is proportional to the current $I_{SW}$ flowing through transistor 201—to the threshold voltage $V_{THA}$ of voltage source 407A.

When current $I_{SW}$ is less than $V_{THA}/R_{SNS}$, the output signal OC of comparator 501 is low thus keeping amplifier 405 disabled. When amplifier 405 is disabled, its output signal OA is tri-stated. Inverter 503 inverts the output signal of comparator 501 and applies the inverted signal to AND gate 505. The other input terminal of AND gate 505 receives signal EN, as shown. Accordingly, when signal EN is enabled and output signal OC of comparator 501 is low, the output of AND gate 505 is high, thereby turning transistor 507 on, which in turn, causes transistor 201 to be on.

When current $I_{SW}$ is greater than $V_{THA}/R_{SNS}$, the output signal OC of comparator 501 is high thereby (i) turning on amplifier 405, and (ii) turning off transistor 507. When enabled, amplifier 405's output is low when $(I_{SW}*R_{403})<(V_{THA}+V_{THB})$. This allows transistor 201 to remain on while current $I_{SW}$ remains less than $I_{MAX}$ defined below:

$I_{MAX}=(V_{THA}+V_{THB})/R_{SNS}$ where $R_{403}$ is the resistance of resistor 403. When an output overload condition demands a current higher than $I_{MAX}$, amplifier 405 increases the gate voltage of transistor 201 thereby keeping the switch current $I_{SW}$ regulated at $I_{MAX}$.

To turn off switch 550, signal EN is deasserted. Accordingly, output signal OA of amplifier 405 is tri-stated, transistor 507 is turned off, and transistor 409 is turned on to pull the gate voltage of transistor 201 to its source voltage, which in turn causes transistor 201 to be turned off In one example, the currents consumed by comparator 501 and amplifier 405 are respectively 0.1 μA, and 25 μA. Therefore, in accordance with this example, the operating current of switch 550 is nearly 0.1 μA when $I_{SW}<(V_{THA}+V_{THB})/R_{403}$ (only comparator 501 is enabled). The operating current increases to 25.1 μA only when $I_{SW}>(V_{THA}+V_{THB})/R_{403}$ (both comparator 501 and amplifier 405 are enabled). Thus, at low $I_{SW}$ current levels where low current consumption of the switch 550 is most desirable, the invention results in an operating current which is substantially smaller than that of conventional switches. Considering representative operating current values given in previous paragraphs, for low load currents where $I_{SW}<(V_{THA}+V_{THB})/R_{403}$, this arrangement results in a very low overall power switch operating current of 658 nA versus 40 μA attainable by a prior art power switch.

Figure 7:
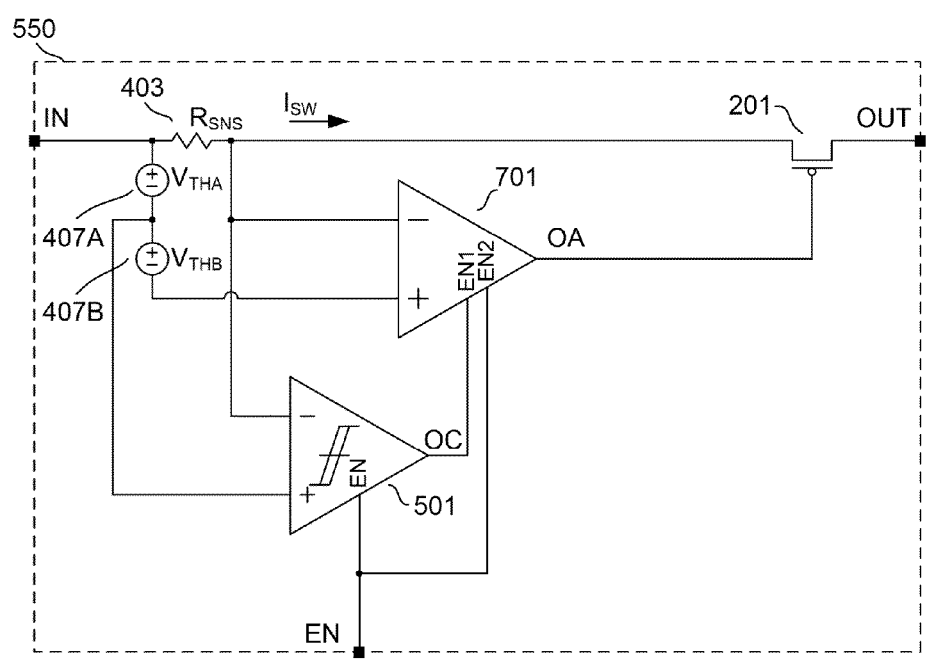
FIG. 7 is a transistor schematic diagram of the switch disposed in the switching circuit of FIG. 4, in accordance with another embodiment of the present invention.

FIG. 7 is a schematic diagram of switch 550 of FIG. 4, in accordance with another exemplary embodiment of the present invention. Switch 550 is shown as including, in part, a comparator 501, an amplifier 701, and transistor 201 whose gate terminal is controlled by the output signal OA of amplifier 701.

When signal EN is deasserted, e.g. pulled to a logic low, the Comparator 501 and Amplifier 701 are disabled with the output signal OA of Amplifier 701 pulling the gate voltage of transistor 201 to its source voltage, which in turn causes transistor 201 to be turned off. In this state, Switch 550 is off.

When signal EN is asserted, e.g., pulled to a logic high, Comparator 501 is enabled and Amplifier 701 becomes responsive to its output signal OC. Comparator 501 is adapted to compare the voltage across resistor 403—which is proportional to the current $I_{SW}$ flowing through transistor 201—to the threshold voltage $V_{THA}$ of voltage source 407A. When current $I_{SW}$ is less than $V_{THA}/R_{SNS}$, the output signal OC of comparator 501 applied to EN1 terminal of amplifier 701 is low which disables Amplifier 701 with its output signal OA pulling the gate of transistor 201 low, which in turn causes transistor 201 to be fully turned on. In this mode, the switch 550 is on and is low-current consumption mode.

When current $I_{SW}$ is greater than $V_{THA}/R_{SNS}$, the output signal OC of comparator 501 is high thereby enabling amplifier 701. When enabled, amplifier 701's output is low when $(I_{SW}*R_{403})<(V_{THA}+V_{THB})$. This allows transistor 201 to remain on while current $I_{SW}$ remains less than $I_{MAX}$ defined below:

$I_{MAX}=(V_{THA}+V_{THB})/R_{SNS}$ where $R_{403}$ is the resistance of resistor 403. When an output overload condition demands a current higher than $I_{MAX}$, amplifier 701 increases the gate voltage of transistor 201 thereby keeping the switch current $I_{SW}$ regulated at $I_{MAX}$.

The above embodiments of the present invention are illustrative and not limitative. Various alternatives and equivalents are possible. The embodiments of the present invention are not limited by the type of comparator, amplifier, oscillator, etc. The embodiments of the present invention are not limited by the type of transistor, PMOS, NMOS or otherwise, used in the switching circuit. The embodiments of the present invention are not limited by the type of integrated circuit in which the present invention may be disposed. Nor are the embodiments of the present invention limited to any specific type of process technology, e.g., CMOS, Bipolar, or BICMOS that may be used to manufacture a magnetic random access memory. Other additions, subtractions or modifications are obvious in view of the present invention and are intended to fall within the scope of the appended claims.

What is claimed is:

1. A switching circuit comprising:
   an oscillator operative to generate an oscillating signal, said oscillating signal having on periods that are substantially shorter than its off periods;

a detector responsive to an input signal and to the oscillating signal, said detector operating in a low-current mode during the off periods of the oscillating signal and operating in an active mode during the on periods of the oscillating signal, said detector generating a detect signal in response to a magnitude of the input signal in comparison to a threshold value when operating in the active mode;
a memory element operable to store the detect signal; and
a switch receiving the input signal and adapted to be turned off when said stored detect signal is in a first logic state and turned on when said stored detect signal is in a second logic state.

2. The switching circuit of claim 1 wherein said memory element comprises a sequential logic block having a data terminal receiving the detect signal and a clock terminal receiving the oscillating signal.

3. The switching circuit of claim 1 wherein:
said input signal is an input voltage; and
said detect signal is generated in response to the input voltage being lower than a threshold value.

4. The switching circuit of claim 1 wherein:
said input signal is an input voltage; and
said detect signal is generated in response to the input voltage being higher than a threshold value.

5. A switching circuit comprising:
an oscillator operative to generate an oscillating signal, said oscillating signal having on periods that are substantially shorter than its off periods;
a detector responsive to an input signal and to the oscillating signal, said detector operating in a low-current mode during the off periods of the oscillating signal and operating in an active mode during the on periods of the oscillating signal, said detector generating a detect signal in response to a magnitude of the input signal in comparison to a threshold value when operating in the active mode;
a memory element operable to store the detect signal;
a switch adapted to be turned off when said stored detect signal is in a first logic state and turned on when said stored detect signal is in a second logic state; wherein
said input signal is a chip temperature; and
said detect signal is generated in response to the chip temperature being higher than a threshold value.

6. A method of supplying current to a load, the method comprising:
generating an oscillating signal, said oscillating signal having on periods that are substantially shorter than its off periods;
operating a detector in a low-current mode during the off periods of the oscillating signal and in an active mode during the on periods of the oscillating signal;
generating a detect signal by the detector during the on periods of the oscillating signal in response to a magnitude of an input signal in comparison to a threshold value;
storing the detect signal;
applying the input signal to a switch;
turning on the switch to supply the current if the stored detect signal is in a first logic state; and
turning off the switch so as not to supply the current if the stored detect signal is in a second logic state.

7. The method of claim 6 further comprising:
performing a logical operation on the stored detect signal;
switching the current on or off in response to a result of the logical operation.

8. A switch comprising:
a resistive element receiving an input voltage;
a first transistor coupled to the resistive element;
a comparator responsive to the resistive element and a threshold value, said comparator generating an output signal having a first value if a current flowing through the first transistor is detected as being smaller than a first threshold value, wherein the output signal of the comparator has a second value if the current is detected as being greater than the first threshold value; and
an amplifier operative to be disabled in response to the first value of the output signal of the comparator, and to be enabled in response to the second value of the output signal of the comparator.

9. The switch of claim 8 wherein in response to the first value of the output signal of the comparator, said amplifier causes said first transistor to be on.

10. The switch of claim 8 wherein said first threshold value is defined by a resistance of the resistive element and a first threshold voltage.

11. The switch of claim 10 wherein in response to the second value of the output signal of the comparator, the amplifier causes the current flowing through the first transistor to have an upper value defined by a second threshold value.

12. The switch of claim 8 wherein in response to the second value of the output signal of the comparator, the second transistor is off.

13. The switch of claim 11 wherein said second threshold value is defined by the resistance of the resistive element and a sum of the first threshold voltage and a second threshold voltage.

14. The switch of claim 8 wherein said comparator is further responsive to an enabling signal, wherein when said enabling signal is deasserted, the output signal of the comparator has the first value of the output signal of the comparator.

15. The switch of claim 8 wherein said amplifier is further responsive to an enabling signal, wherein when the enabling signal is deasserted, said amplifier causes said first transistor to be off.

16. A method of controlling a current flowing through a transistor, the method comprising:
generating a comparison signal having a first value if the current flowing through the transistor is detected as being smaller than a first threshold value, wherein the comparison signal has a second value if the current flowing through the transistor is detected as being greater than the first threshold value;
disabling an amplifier in response to the first value of the comparison signal; and
enabling the amplifier in response to the second value of the comparison signal.

17. The method of claim 16 further comprising:
turning the transistor on when the amplifier is disabled.

18. The method of claim 16 wherein said first threshold value is defined by a resistance of a resistive element and a first threshold voltage.

19. The method of claim 16 wherein in response to the second value of the comparison signal, the amplifier causes the current flowing through the transistor to have an upper value defined by a second threshold value.

20. The method of claim 19 wherein said second threshold value is defined by the resistance of the resistive element and a sum of the first threshold voltage and a second threshold voltage.

21. The method of claim 16 further comprising:
causing the comparison signal to have the first value in response to deassertion of an enabling signal.

22. The method of claim 21 wherein said transistor comprises at least two transistors connected in series.

23. A method of supplying current to a load, the method comprising:
generating an oscillating signal, said oscillating signal having on periods that are substantially shorter than its off periods;
operating a detector in a low-current mode during the off periods of the oscillating signal and in an active mode during the on periods of the oscillating signal;
generating a detect signal by the detector during the on periods of the oscillating signal in response to a magnitude of an input signal in comparison to a threshold value;
storing the detect signal;
turning on the switch to supply the current if the stored detect signal is in a first logic state; and
turning off the switch so as not to supply the current if the stored detect signal is in a second logic state, wherein said input signal is a chip temperature and wherein said detect signal is generated in response to the chip temperature being higher than a threshold value.

* * * * *